United States Patent [19]

Madsen et al.

[11] Patent Number: 5,312,755
[45] Date of Patent: May 17, 1994

[54] CONTRAST RESOLUTION TISSUE MIMICKING PHANTOMS FOR NUCLEAR MAGNETIC RESONANCE IMAGING WITH STABLE NMR PROPERTIES

[75] Inventors: Ernest L. Madsen, Madison, Wis.; Joseph C. Blechinger, Moore, Okla.; Gary R. Frank, Madison, Wis.

[73] Assignee: Wisconsin Alumni Research Foundation, Madison, Wis.

[21] Appl. No.: 751,621

[22] Filed: Aug. 14, 1991

Related U.S. Application Data

[63] Continuation of Ser. No. 315,923, Feb. 24, 1989, abandoned.

[51] Int. Cl.[5] .................. G01N 24/08; G01V 3/00
[52] U.S. Cl. .................. 436/8; 436/173; 324/300; 324/307; 324/308; 128/653.2; 252/315.3
[58] Field of Search ............... 436/8–18, 436/173; 324/300, 307–309, 318–322; 128/653.2; 252/315.3

[56] References Cited

U.S. PATENT DOCUMENTS

| | | |
|---|---|---|
| 2,824,092 | 2/1958 | Thompson ............... 252/315.3 X |
| 4,551,678 | 11/1985 | Morgan et al. ............... 324/300 |
| 4,613,819 | 9/1986 | Chui . |
| 4,625,168 | 11/1986 | Meyer et al. . |
| 4,644,276 | 2/1987 | Sierocuk et al. ............... 324/300 X |
| 4,692,704 | 9/1987 | Gray ............... 324/300 X |
| 4,701,709 | 10/1987 | Yamamoto et al. . |
| 4,719,406 | 1/1988 | Schaefer et al. . |
| 4,729,892 | 3/1988 | Beall . |
| 4,749,948 | 6/1988 | Duby et al. . |
| 4,774,957 | 10/1988 | Nambu et al. ............... 128/653.2 |
| 4,777,442 | 10/1988 | Rosenthal . |
| 4,782,502 | 11/1988 | Schulz . |
| 4,843,866 | 7/1989 | Madsen et al. ............... 73/1 |
| 4,905,700 | 3/1990 | Wokalek et al. ............... 252/315.2 |

OTHER PUBLICATIONS

Gamsu, G. et al. "A Preliminary Study of MRI Quantification of Simulated Calcified Pulmonary Nodules" *Invest. Radiol.* 1987, 22, 853–858.

(List continued on next page.)

*Primary Examiner*—James C. Housel
*Assistant Examiner*—A. Soderquist
*Attorney, Agent, or Firm*—Foley & Lardner

[57] ABSTRACT

Tissue mimicking phantoms for NMR imagers are produced having a base tissue mimicking material enclosed within a sealed container. The base tissue mimicking material is a gel solidified from a mixture of agar, animal hide gelatin, water, glycerol, and anti-bacterial agents such as n-propanol, p-methylbenzoic acid, and formaldehyde. The formaldehyde also serves to cross link the animal hide gel and thereby raise the melting point of the tissue mimicking material to a temperature above normal ambient temperatures. This base tissue mimicking material is stable both in dimensions and NMR properties over long periods of time. Contrast resolution inclusions are formed within the base tissue mimicking material which have $T_1$, $T_2$, or both which differ from the corresponding values for the base tissue mimicking material, thereby allowing these inclusions to be imaged and distinguished from the surrounding material. The inclusions simulate tumors in normal tissue, and are preferably formed in a variety of sizes down to very small diameter spherical objects which are at or beyond the imaging capability of the NMR imaging apparatus. Inclusions which are stable in size, shape and NMR properties over time while in direct contact with the base tissue mimicking material without the need for a barrier are formed of the same solidified gel material as the base tissue mimicking material but differing in the dry weight concentration of agar. Several sets of inclusions may be formed so that each set will have a different level of contrast with the base tissue mimicking material.

37 Claims, 7 Drawing Sheets

OTHER PUBLICATIONS

Blechinger, J. C. et al. "Tissue-Mimicking Gelatin-Agar Gels for Use in Magnetic Resonance Imaging Phantoms" *Med. Phys.* 1988, 15, 629–636.

Madsen, E. L. et al. "Low-Contrast Focal Lesion Detectability Phantom for $^1$HMR Imaging" *Med. Phys.* 1991, 18, 549–554.

Mathur-DeVre, et al. "The Use of Agar Gel as a Basic Reference Material for Calibrating Relaxation Times and Imaging Parameters," Magnetic Resonance Medicine, vol. 2, 1985, pp. 176–179.

Mitchell, et al., "Agarose as a Tissue-Equivalent Phantom Material for NMR Imaging," Magnetic Resonance Imaging, vol. 4, 1986, pp. 263–266.

Dixon, "Simple Proton Spectroscopic Imaging," Radiology, vol. 153, 1984, pp. 189–194.

Mano, et al., "New Polyvinyl Alchol Gel Material for MRI Phantoms," Magnetic Resonance Medicine, vol. 3, 1986, pp. 921–926.

DeLuca, et al., "Biological Tissue Simulation and Standard Testing Material for MRI," Magnetic Resonance Medicine, vol. 4, 1987, pp. 189–192.

Blechinger, et al., "NMR Properties of Tissue-Like Gel Mixtures for Use as Reference Standards or in Phantoms," Medical Physics, vol. 12, No. 4, 1985, p. 516 (Abstract).

Madsen, et al., "Prospective Tissue-Mimicking Materials for Use in NRM Imaging Phantoms," Magnetic Resonance Imaging, vol. 1, 1982, p. 135.

Dixon, et al., "A Tissue-equivalent Gel for NMR Phantoms," Medical Physics, vol. 13, No. 4, Jul./Aug. 1986, p. 602 (Abstract).

CONTRAST RESOLUTION TISSUE MIMICKING PHANTOMS FOR NUCLEAR MAGNETIC RESONANCE IMAGING WITH STABLE NMR PROPERTIES

This invention was made with United States government support awarded by the Department of Health and Human Services (NIH), Grant #: CA25634. The United States Government has certain rights in this invention.

This is a continuation of application Ser. No. 07/315,923 filed Feb. 24, 1989, abandoned.

FIELD OF THE INVENTION

This invention pertains generally to products and techniques for testing the resolution capabilities of nuclear magnetic resonance (NMR) imaging equipment and particularly to imaging processes in which hydrogen is the monitored nucleus.

BACKGROUND OF THE INVENTION

The early detection of cancer using medical imaging equipment requires the ability to detect small lesions or to delineate the boundaries of lesions that have properties close to those of the surrounding normal tissue. The measure of the smallest object visible with a given contrast is called the resolution of the imaging system. Contrast resolution and other performance tests of a medical imaging system are performed with objects called phantoms. A phantom with low contrast, like that of tissues, is required for the evaluation of the contrast resolution of the system. Such phantoms are commercially available for use with X-ray computed tomography and ultrasound imaging systems but are not generally available for nuclear magnetic resonance (NMR) imaging systems. NMR has particular advantages in investigations of the spinal cord and knee where bone impedes X-rays and ultrasound, and for evaluation of cardiac performance without using contrast agents as are needed in X-ray angiography.

Hydrogen magnetic resonance imaging is generally a more complicated imaging procedure than X-ray or ultrasound since it does not measure just one dominant property, such as electron density in the case of X-ray computed tomography, but is affected by the hydrogen atom density, flow, and two relaxation phenomena. The contrast, or differences in image brightness, in an NMR image is primarily due to differences in the relaxation times of tissues. It has been found that there are relaxation time differences between normal tissue and certain tumors, which makes NMR imaging potentially very valuable in early detection of such tumors.

A satisfactory NMR phantom must satisfy several, sometimes conflicting requirements. First, the material of which the phantom is made should mimic the hydrogen density and relaxation times of several types of tissues. Second, the relaxation times of the material should not change over time, such as over several months or years, so that the phantom can be used in tests of imager reproducability. Third, if the phantom includes inclusions of materials within the surrounding matrix which have different NMR characteristics than the surrounding matrix, these inclusions must be stable over time in both shape and in NMR relaxation times, $T_1$ and $T_2$.

Soft tissues exhibit $T_1$'s ranging from about 200 milliseconds (ms) to 1200 ms and $T_2$'s from about 40 ms to 200 ms. Typical values for the ratio $T_1/T_2$ lie between 4 and 10 for soft tissues. For a given soft tissue parenchyma, $T_1$ in particular can exhibit a significant dependence on frequency as well as temperature.

Materials which have been proposed for use in phantoms to mimic soft tissues with respect to one or more NMR properties include aqueous solutions of paramagnetic salts and water based gels of various forms. Such gels may also contain additives such as a paramagnetic salt for control of $T_1$.

Aqueous solutions of paramagnetic salts can be used in phantoms to produce a desired value of either $T_1$ or $T_2$. The ratio of $T_1/T_2$ in the salt solutions is almost always less than 2, however, rendering such solutions inadequate for the close mimicking of soft tissue, with the possible exception of body fluids.

Phantom materials composed of water based agar gels doped with $MnCl_2$ to control $T_1$ have been reported. R. Mathur-DeVre, et. al., "The Use of Agar as a Basic Reference for Calibrating Relaxation Times and Imaging Parameters, " Magn. Reson. Med., Vol. 2, 1985, p. 176. Agar gels doped with $CuSO_4$ have also been reported. M. D. Mitchell, et al., "Agarose as a Tissue-Equivalent Phantom Material for NMR Imaging," Magn. Reson. Imag., Vol. 4, 1986, p. 263. To produce sufficiently low values of $T_1/T_2$ for mimicking soft tissues, a rather low dry weight concentration of agar must be used (1% to 2%). When employing agar gels of these low concentrations in sealed glass containers, slow shrinkage of about 2% in volume over a period of months has been observed, with fluid being extruded at the boundaries, making such materials unsuitable for forming complex phantoms such as contrast resolution phantoms or anthropomorphic phantoms.

A material in which very high dry weight concentrations of agar and animal hide gels were employed to control (i.e., lower) $T_1$ without use of paramagnetic salts has been reported by W. T. Dixon, "Simple Proton Spectroscopic Imaging," Radiology, Vol. 153, 1984, p. 189. Production of these very high gel concentrations apparently requires considerable time, effort and care. Failure to produce stable complex phantoms was also reported.

A polyvinyl alcohol gel is described by I. Mano, et al., "New Polyvinyl Alcohol Gel Material for MRI Phantoms," Magn. Reson. Med. Vol. 2, 1986, p. 921. This material appears to lack the long term stability desired in phantoms; the relaxation times reportedly decreased 4% to 12% in six months. Another disadvantage exhibited was extrusion of fluid at boundaries of the material. A polyacrylamide gel material proposed as a tissue mimicking material is described in F. DeLuca, et al., "Biological Tissue Simulation and Standard Testing Material for MRI," Magn. Reson. Med., Vol. 4, 1978, p. 189.

A phantom material consisting of mixtures of agar gel and animal hide gel in which $CuSO_4$ was used to lower $T_1$ has also been reported. Unfortunately, a long-term instability manifested itself in that a steady, very slow rise in $T_1$ was observed over a period of months. This instability precludes the use of this material in MRI phantoms. The rise in $T_1$ was perhaps due to the slow formation of metal-organic complexes, removing the $Cu^{++}$ paramagnetic ions. J. C. Blechinger, et al., "NMR Properties for Tissue-Like Gel Mixtures for Use as Reference Standards or in Phantoms," Med. Phys., Vol. 12, 1985, p. 516 (Abstract).

E. L. Madsen, et al., "Prospective Tissue-Mimicking Materials for Use in NMR Imaging Phantoms," Magn. Reson. Imag., Vol. 1, 1982, p. 135, reported water-based animal hide gels which depended upon the concentration of glycerol for control of $T_1$ and on the concentration of graphite powder for control of $T_2$. Unfortunately, the instrument used in the work reported on in that article employed what has become known as the simple Hahn Spin-Echo Pulse Sequence for Measuring $T_2$. Later measurements, made with an instrument using the Carr-Purcell-Meiboon-Gill (CPMG) pulse sequence, expose a strong dependence of the apparent $T_2$ on 2, the time between 180° pulses. No well defined $T_2$ could be established for the materials using the CPMG pulse sequence. It is likely that the microscopic diamagnetic graphite particles caused inhomogeneities in the magnetic induction, $B_0$, to such an extend that even the CPMG pulse sequence was unable to eliminate their effect.

SUMMARY OF THE INVENTION

In accordance with the present invention a tissue mimicking phantom utilizes a base tissue mimicking material which is a gel solidified from a mixture of animal hide gelatin, agar, water and glycerol. The amount of glycerol can be used to control the $T_1$; that is, the solution used in making the base material can be varied in the glycerol to water ratio to obtain the $T_1$ value desired. It is of particular significance that the glycerol to water ratio has been found to have little effect on the $T_2$ value of the base material.

These tissue mimicking materials can be made to have hydrogen $T_1/T_2$ ratios, as well as $T_1$ and $T_2$ values themselves, which span the ranges found in normal and abnormal soft tissues. The frequency dependence found for these materials also simulates that found in nonfat type soft tissues, and the base material exhibits long term stability in its NMR properties. In addition, the $T_1$ and $T_2$ values can be specified accurately for the materials in the phantom if the temperature of the phantom is known. These materials do not shrink and extrude solution at their boundaries, and therefore are satisfactory for the construction of complex phantoms, and can be produced using straightforward and relatively rapid manufacturing techniques.

The preferred base material includes a mixture of agar, animal hide gelatin, distilled water (preferably deionized), glycerol, n-propyl alcohol, formaldehyde, and p-methylbenzoic acid. The water must be free of any paramagnetic materials. The n-propanol, formaldehyde and p-methylbenzoic acid prevent bacterial attack. In addition, the formaldehyde also produces cross linking of the animal hide gel molecules, which raise the melting point of the gel from about 33° C. to at least 100° C. Thus, instabilities relating to melting and resolidifying during normally occurring environmental temperatures is avoided. Other comparable bacterial inhibitors and cross linking agents may also be utilized. It is found that a concentration of n-propyl alcohol maintained at about 8.3% by volume of the fluid components is satisfactory, while the concentrations of p-methylbenzoic acid and formaldehyde may be made proportional to the concentration of animal hide gel. Preferably, the ratio of p-methylbenzoic acid mass to dry mass of animal hide gel is maintained at 0.0065 and the ratio of the mass of formaldehyde to the dry mass of animal hide gel is 0.017.

In a production technique for the base tissue mimicking material which allows easy selection of the final $T_1$ and $T_2$ values, two containers of molten gel are initially provided, one container having dissolved agar gelling liquid (e.g., 4.3% dry weight percent agar) and the other container having dissolved animal hide gelling liquid (e.g., 18.7% dry weight percent animal hide gelatin). Any sample of the tissue mimicking material made contains X% from the molten animal hide gel container and Y% from the molten agar container, with $X+Y=100$ so that X and Y are volume percentages. The desired percentages of the two components are then mixed together to yield the desired relative proportion of the two. Preferably, both the molten agar and the molten animal hide gel have the same selected concentration of glycerol (e.g., 17% of the liquid components) so that this percentage remains constant in the final product. Preferably, the bacterial inhibitors such as the n-propyl alcohol and the p-methylbenzoic acid are mixed with the glycerol prior to the mixing of the glycerol with the agar and animal hide gel components. However, the formaldehyde is not added until the agar and animal hide gel components are combined and mixed because of the cross linking effect of the formaldehyde.

A contrast resolution phantom formed in accordance with the present invention includes a base tissue mimicking material which may be prepared as set forth above and, imbedded therein, a plurality of inclusions which have NMR properties which differ from the base tissue mimicking material. Preferred inclusions are spherical in form and may be arranged so that several inclusions which span a range of diameters down to the smallest diameter which may conceivably be imaged by conventional NMR imaging apparatus are provided (e.g., from several centimeters to a minimum size in the range of 2 millimeters). These inclusions differ from the surrounding base tissue mimicking material in $T_1$, or $T_2$, or both, but yet are formed so that they are both stable in physical conformation over time and in their NMR properties. These conditions are achieved by producing the spherical inclusions separately from the base tissue mimicking material of an identical material but having a different dry weight concentration of agar. It is found that by varying the dry weight concentration of agar between the inclusions and the surrounding base tissue mimicking material, a desired degree of contrast can be obtained between the inclusions and the surrounding material, while the differences in agar concentration between the base material and inclusions does not affect either the long term conformation stability of the inclusions or the long term NMR properties of the inclusions or the surrounding base material. Differences in contrast between the surrounding base material and the spherical inclusions may also be obtained by the use of an added solid to the base material and the inclusions that has little NMR response but displaces some of the gelatin solution, decreasing the apparent $^1H$ density to the NMR instrument with little change in the reaction times. For example, finely powdered nylon can be added and mixed into the base material with different, e.g., lesser amounts of the finely powdered nylon being added to the inclusions to obtain a desired degree of contrast between the base material and the inclusions. Because the other properties of the material of the inclusions and the base material are the same, no changes occur over time in either the conformation of the inclusions or the NMR relaxation times of the inclusions or the adjacent base material.

A contrast resolution phantom may be formed utilizing the materials of the present invention by packaging the base tissue mimicking material in a container, which is sealed to prevent substantial oxygen entry or evaporation of liquid. The container may include an inner container of (e.g., acrylic) plastic holding the base tissue mimicking material, an outer container of glass holding the inner container and additional tissue mimicking material which surrounds the inner container. Petroleum jelly preferably covers the tissue mimicking material across the top of the outer container to form an oxygen and moisture barrier. A plurality of inclusions may be formed within the base material, e.g., as a set or sets of inclusions formed as spheres of gradually decreasing diameter down to the diameter of a sphere as small or smaller than the smallest diameter that the imaging system can resolve. The sets of inclusions may differ in contrast with each other as well as from the base material to further test the imaging equipment. The inner container itself may be formed with means for determining the slice profile, position and orientation of the NMR image, such as perpendicular and oblique grooves at the sidewalls of the inner container which serve as slice indicators on the NMR image.

Further objects, features, and advantages of the invention will be apparent from the following detailed description when taken in conjunction with the accompanying drawings.

DETAILED DESCRIPTION OF THE INVENTION

The tissue mimicking material of the phantom of the present invention is composed of gel solified from a mixture of agar, animal hide gelatin and glycerol dissolved in water. Hydrogen is the target nucleus. The glycerol content can be varied to control the value of $T_1$ independently of $T_2$, since the glycerol to water ratio has little effect on the $T_2$ value of the material. This tissue mimicking material can be produced in the proper mixture of components to have $T_1/T_2$ ratios, as well as $T_1$ and $T_2$ values themselves, which span the ranges found in normal and abnormal soft tissues. The frequency dependence of $T_1$ and $T_2$ in this tissue mimicking material simulates that found in nonfat type soft tissues, and the material exhibits long term stability of the $T_1$ and $T_2$ values.

The temperature dependencies of $T_1$ and $T_2$ can also be determined for the tissue mimicking material of the invention over a range of temperatures which phantoms may experience during their use in NMR imaging. Thus, $T_1$ and $T_2$ values can be accurately specified for the material in the phantom if the temperature of the phantom is known.

In addition to the agar, animal hide gel and glycerol, the tissue mimicking material also preferably includes components which stabilize the material against attack by micro-organisms, particularly bacterial attack, and cross linking agents to stabilize the gel. For example, n-propanol, formaldehyde and p-methylbenzoic acid can be utilized to prevent bacterial invasion, with the formaldehyde also producing cross linking of the animal hide gel molecules to raise the melting point of the material.

The following is an exemplary general technique for producing a typical tissue mimicking material in accordance with the present invention. Initially, two containers of molten gel components are provided, one containing (e.g., 4.5% dry weight) agar dissolved in liquid and the other containing (e.g., 18.7% dry weight) animal hide gelatin dissolved in liquid. As used herein, the "dry weight" percent is the relative weight of the dry gelling agent to the weight of the liquid, which includes water, glycerol, and certain anti-bacterial agents (e.g., n-propanol). As an example, 4.5% dry weight agar corresponds to 45 grams of agar dissolved in 1000 grams (about 1000 ml) of liquid. A sample of the tissue mimicking material is made by combining X% of the molten agar component with Y% of the molten animal hide gel component such that $X + Y = 100$. The relative amounts of agar and animal hide gel may thus be specified in terms of only one of the two components, for example in terms of X% molten animal hide gel.

The following describes an exemplary composition for a tissue mimicking material in which X=40% animal hide gel (and therefore Y=60% agar) with the glycerol concentration being 30% of the liquid components. Initially, a quantity of molten agar and a quantity of molten animal hide gel are produced, each with 30% glycerol in the liquid. To produce one liter of final tissue mimicking material, at least 400 millimeters (ml) of the molten animal hide gel material and 600 ml of the molten agar material must be available. Generally, an extra 100 ml of each should be made available to allow for incidential loss of material during manufacturer. The liquid components are mixed first. Since p-methylbenzoic acid is more miscible in hot alcohol than in water, initially 0.75 milligrams (mg) of p-methylbenzoic acid is added to 41.5 ml n-propanol and the mixture is heated to above 90° C. and stirred until the acid is completely dissolved. Next, the solution is combined with 150 ml of glycerol and 308.5 ml of distilled deionized water at room temperature. This 500 ml solution will be used to make the animal hide gel component. The mixture will be slightly cloudy after stirring, but uniform in appearance. The liquid for the agar component is a mixture of 58 ml n-propanol, 210 ml glycerol and 432 ml distilled deionized water. 116 grams of dry powdered animal hide gelatin are added to the 500 ml solution and mixed and stirred vigorously. Similarly, 31.5 grams of dry agar are added to the 700 ml solution and mixed in thoroughly. The containers in which the two components are produced should be covered (e.g., with "saran wrap" TM) after mixing of gelling agents into solutions to prevent significant evaporation, and then each container is heated, for example, in a double boiler, until the mixtures reach a uniform desired temperature, generally 90° C.

When the materials reach 90° C. and the powdered gels have completely dissolved, the material is stirred until uniform and any air bubbles are removed. The two materials constitute what may be referred to as the molten animal hide gel and the molten agar.

The final molten mixture is next prepared for placement into sample tubes molds or phantom containers. 400 ml of molten animal hide gel and 600 ml of molten agar are combined and stirred well, preferably taking care not to introduce air bubbles into the gels. The formaldehyde is added last and should not be added until the mixture has been cooled to less than 50° C. to prevent premature congealing of the animal hide gel. The mixture can be cooled by partial immersion in a bath of cool tap water while continuously stirring the material. After the cooling to the proper temperature, the formaldehyde, e.g., 4.0 g of 40% formaldehyde solution for the volumes referred to above, is added to the molten tissue mimicking material. The molten material is at this point ready to be poured into a mold or phantom container. At least 24 hours should be allowed for both congealing and cross-linking to occur.

Care should then be taken to prevent oxygen from seeping into the tissue mimicking material. Oxygen is paramagnetic and can change the relaxation time of the material. Seepage of oxygen into the tissue mimicking material can be prevented by placing the material into glass containers or containers made of other gas and liquid impermeable materials, and sealing the top with molten petroleum jelly, which also prevents any desiccation of the gel.

The production of tissue mimicking materials having various gel proportions to illustrate the range of components is discussed in the examples below.

EXAMPLE I

In a first set of six samples, designated herein as the ANAG set, both the molten agar and molten animal hide gel have the same concentration of glycerol, 17% of the liquid components. Thus, when samples of different values of X were produced, the glycerol concentration remained at 17%. The 6 samples were designated on the basis of their X values, i.e., 0%, 20%, 40%, 60%, 80% and 100%. For example, to produce the 40% sample, 40 ml of the molten animal hide gel was added to 60 ml of molten agar in a 150 ml beaker, the combination being mixed thoroughly to form the tissue mimicking material in its molten state. Small quantities of this mixture can be introduced into glass sample tubes, for example, into a 10 mm diameter sample tube for measurements at various frequencies, including 10 MHz, and in a 5 mm diameter sample tube for measurements at 40 MHz. The composition of the six samples is given in Table I below, where the total volume of the liquid components for each is one liter, water comprising 747 ml, glycerol 170 ml, and n-propanol 83 ml.

TABLE I

| X (%) | Dry weight animal hide gelatin (g) | Dry weight agar (g) | p-methyl benzoic acid (g) | 40% formaldehyde solution (ml) |
|---|---|---|---|---|
| 0 | 0 | 45.0 | 0 | 0 |
| 20 | 46.4 | 36.0 | 0.3 | 2.0 |
| 40 | 92.8 | 27.0 | 0.6 | 4.0 |
| 60 | 139.1 | 18.0 | 0.9 | 6.0 |
| 80 | 185.5 | 9.0 | 1.2 | 8.0 |
| 100 | 231.9 | 0 | 1.5 | 10.0 |

Figure 1:
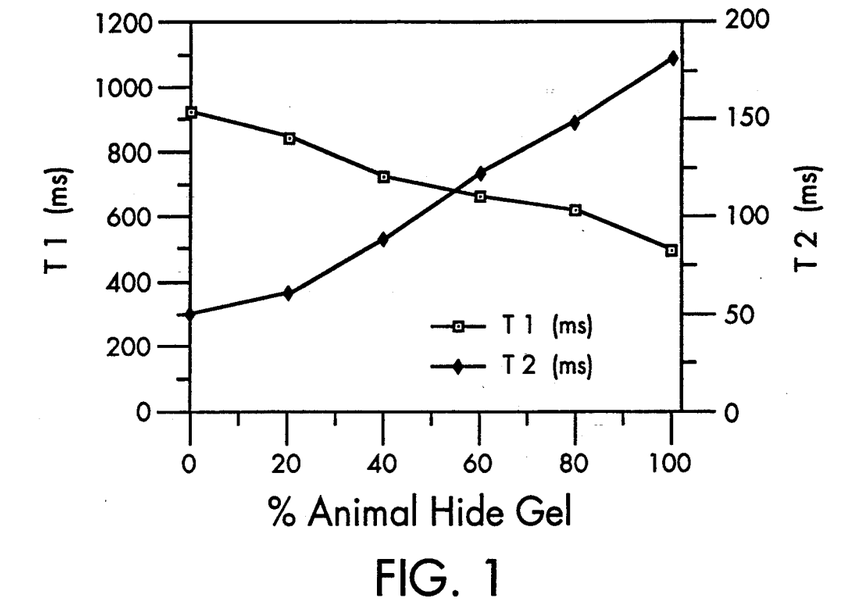
FIG. 1 is a graph showing the relationship between $T_1$ and $T_2$ and the percentage of the animal hide gel component in the base tissue mimicking material.

FIG. 1 is a plot of the relaxation times ($T_1$ and $T_2$) as functions of composition, with all relaxation times being measured at 22° C. using a 10 MHz spectrometer. As seen from these data, the value of $T_2$ depends very strongly on the animal hide gel concentration (i.e., the relative percentage of animal hide gel and agar), varying by a factor of almost four from the composition with 0% animal hide gel to the composition with 100% animal hide gel. The value of $T_1$ also varied with the relative percentages of the two components, but much less markedly than $T_2$.

EXAMPLE II

Another set of nine samples was produced so that each had the same value of X (percent molten animal hide gel) and Y (percent molten agar) but varied in the concentration of glycerol in the liquid component of the material. The value of X chosen was 40%.

In this case, four beakers of molten gels were initially produced. These included two containers of molten agar, one of which contained no glycerol and the other 50% glycerol with respect to the liquid. The other two containers contain molten animal hide gel, one of which contains no glycerol and the other 50% glycerol. Two additional quantities were then made from the four initial materials, one contained no glycerol and was made by combining four parts of the molten animal hide gel with six parts of molten agar, each containing no glycerol, while the other contained 50% glycerol in terms of its liquid components and was made by combining four parts of the molten animal hide gel with six parts of the molten agar, each of the latter having 50% glycerol in its liquid components. Thus, X=40% for both quantities produced, while one quantity contains 0% glycerol and the other 50% glycerol. Using the latter two source quantities, appropriate combinations were produced to yield glycerol concentrations of 0%, 10%, 20%, 25%, 30%, 35%, 40%, 45%, and 50% in terms of the liquid components of the tissue mimicking materials.

Figure 2:
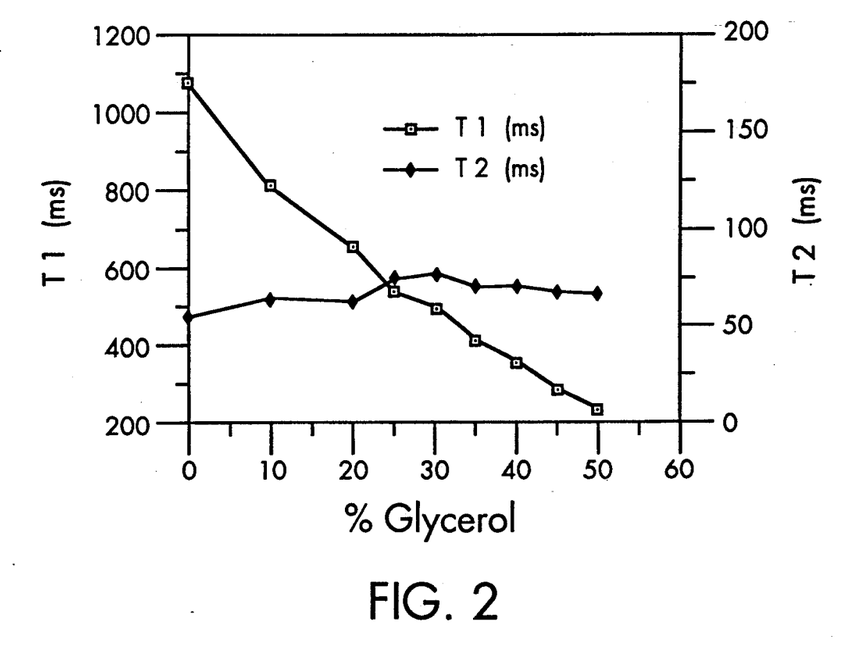
FIG. 2 is a graph showing the relationship between $T_1$ and $T_2$ and the percentage of glycerol in the base tissue mimicking material.

FIG. 2 is a plot of the relaxation times, $T_1$ and $T_2$, for the nine samples, as a function of the percent glycerol in the liquid components of the material, varying from 0% to 50% glycerol. Again, the relaxation times are measured at 22° C. using a 10 MHz spectrometer. As is seen from these data, the $T_1$ values vary dramatically with glycerol concentration whereas the $T_1$ values are virtually unaffected by the glycerol percentage.

Figure 3:
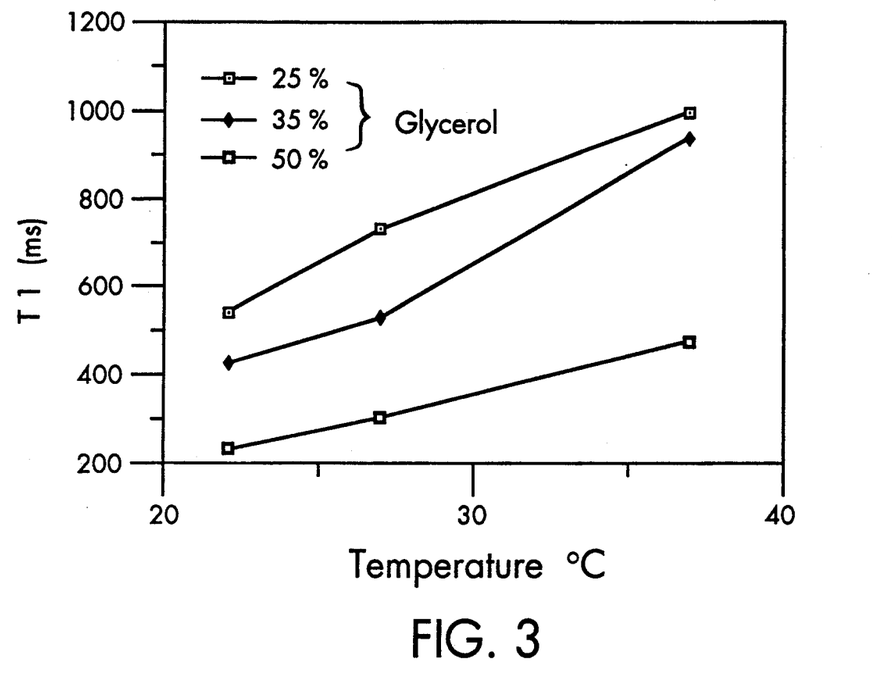
FIG. 3 is a graph showing the relationship between temperature and $T_1$ for three different concentrations of glycerol in the base tissue mimicking material.
Figure 4:
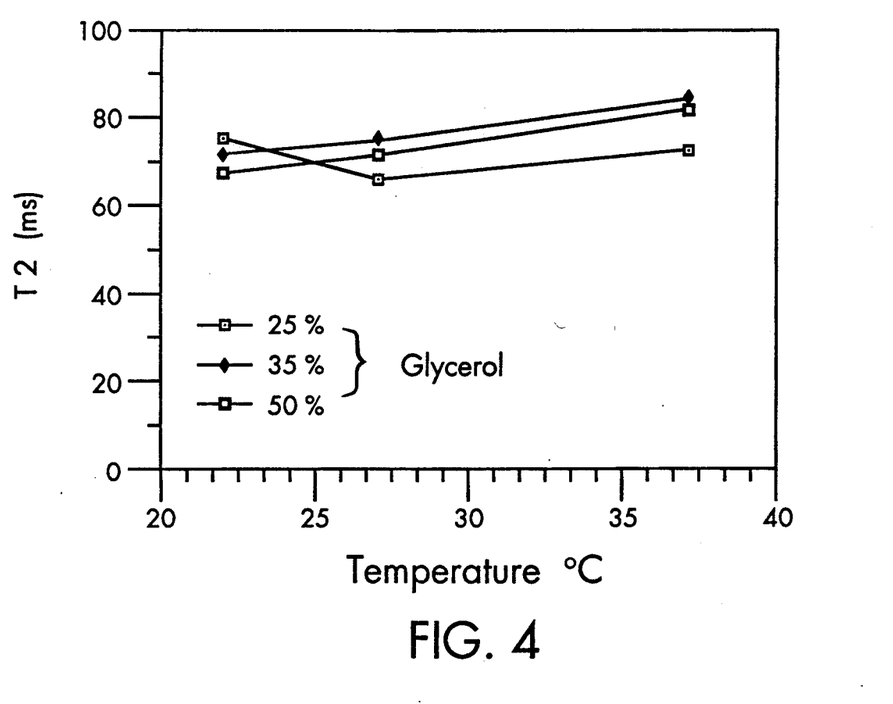
FIG. 4 is a graph showing the relationship between temperature and $T_2$ for three different glycerol concentrations in the base tissue mimicking material.

FIG. 3 and FIG. 4 show the $T_1$ and $T_2$ values, respectively, at 10 MHz and at three temperatures for the samples containing 25%, 35% and 50% glycerol. The three temperatures were 22° C., 27° C. and 37° C., temperatures which span the range from room temperature through body temperature. It is seen that $T_2$ varies little as a function of temperature while $T_1$ is very strongly affected.

EXAMPLE III

A third set of tissue mimicking materials was prepared for a long term test. This set consisted of three samples all having X=50%, but differing in glycerol concentration, specifically having glycerol concentrations as a percentage of the liquid component of 0%, 6.2% and 12.5%.

Figure 5:
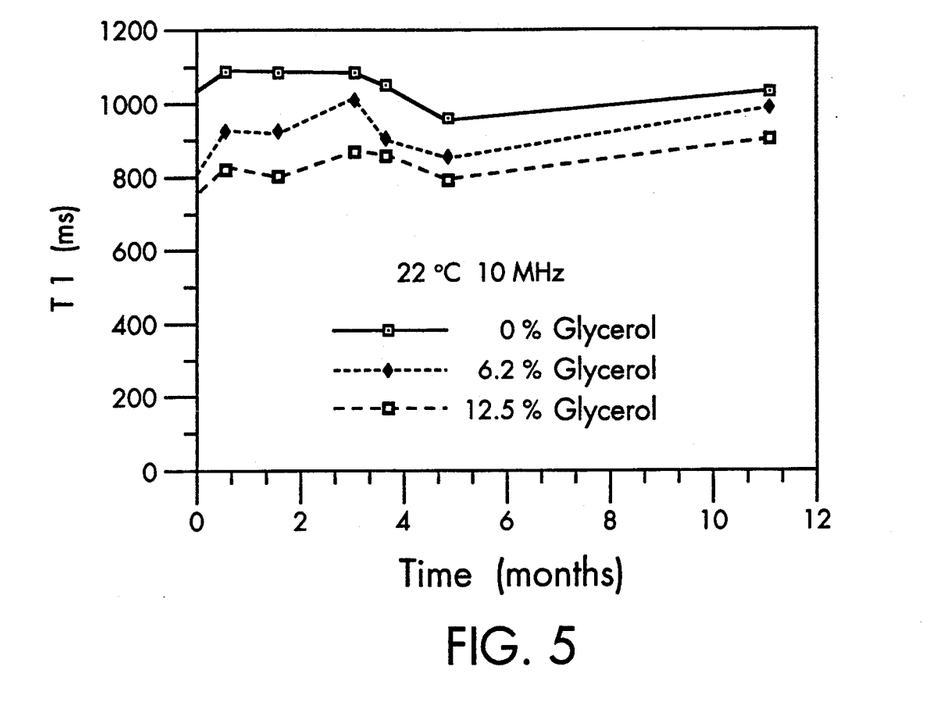
FIG. 5 is a graph showing the measured value of $T_1$ over a period of months in the base tissue mimicking material at various glycerol levels.
Figure 6:
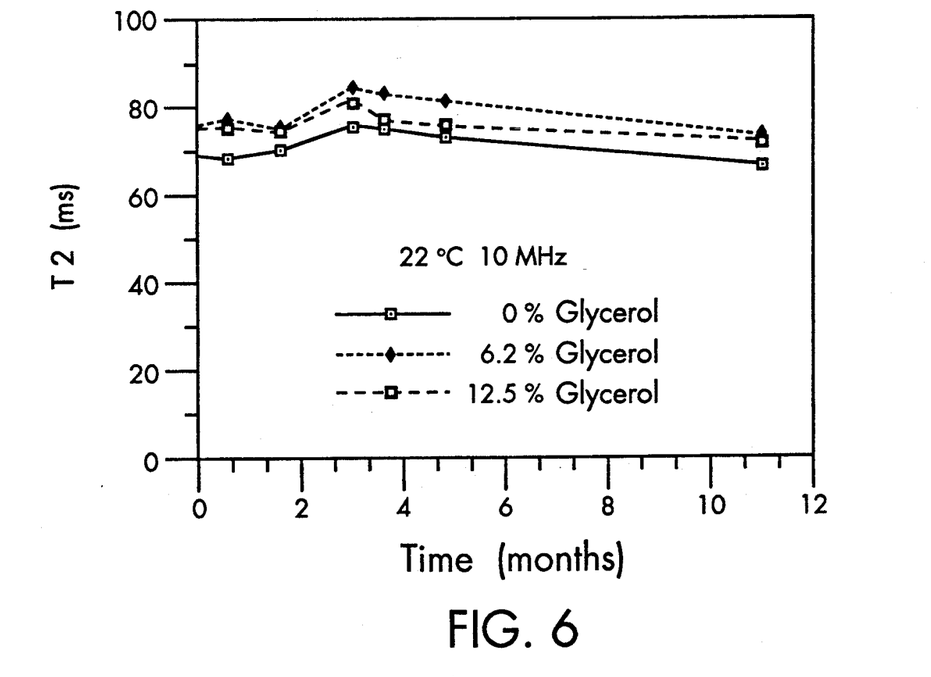
FIG. 6 is a graph showing the measured values of $T_2$ over a period of months for base tissue mimicking materials having various glycerol levels.

FIG. 5 and FIG. 6 show plots of the $T_1$ and the $T_2$ measurements, respectively, made over a twelve month period on the three samples. All measurements were made at 10 MHz and 22° C. It is seen from these measurements that relatively little change occurred in any of the samples in the $T_1$ and $T_2$ values over the twelve month time span.

It is a particular object of the present invention to provide a phantom which can test a magnetic resonance imager's ability to detect small tumors which may differ only slightly in hydrogen NMR properties from their surroundings. Detection of malignant tumors while still small, and in the early stages of the disease, highly increases the likelihood of successful treatment. A sphere is a representative, yet geometrically simple, shape for simulating a tumor.

In producing a stable phantom for magnetic resonance imaging in which NMR properties vary spatially, special attention must be given to avoiding long term diffusion of the solutes between the regions of varying NMR properties. NMR property changes brought about by long term diffusion of hydrogen bearing molecules from one region of the phantom to another would make specification of NMR properties in the phantom difficult, if not impossible. One way to prevent diffusion would be to introduce diffusion barriers which are sufficiently thin that they would not be detectable by the NMR imager. The barrier would be required to have an extremely small diffusion coefficient. However, it is found that separate diffusion barriers, such as a thin glass wall, produce easily detected low signal zones in NMR images. Thus, tissue mimicking materials which simulate tissues with different NMR properties must lie in direct contact with one another and the solute concentrations should generally be the same in each of the tissue mimicking materials.

Diffusion can also result from gel samples shrinking and extruding fluid over time (called syneresis). The extruded fluid can diffuse into the surrounding materials, decreasing the dry weight gel concentrations of the surrounding material and increasing the relaxation times. Correspondingly, the NMR properties of the material from which the fluid is extruded also will change. If these phenomena occur in a tissue mimicking phantom, the phantom is of limited or questionable value for calibration.

In accordance with the present invention, it is now found that a particularly stable and reliable phantom having inclusions within a surrounding base tissue mimicking material can be formed of the tissue mimicking materials described above wherein the difference in relaxation times between the base material and the inclusions is obtained by a difference in the dry weight concentration of agar. The following describes an illustrative phantom formed with the preferred tissue mimicking material and inclusions formed in this manner.

Figure 7:
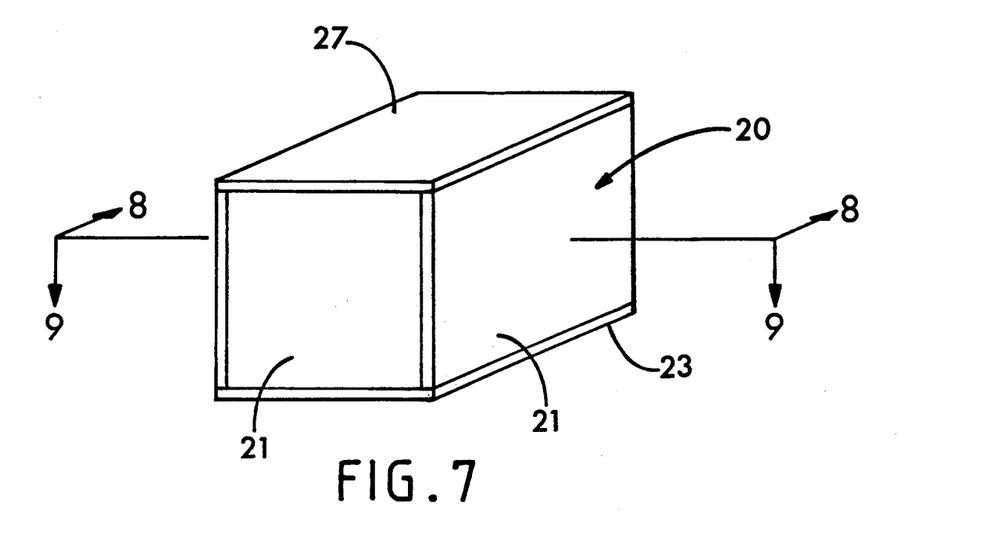
FIG. 7 is a perspective view of an exemplary phantom in accordance with the present invention.
Figure 8:
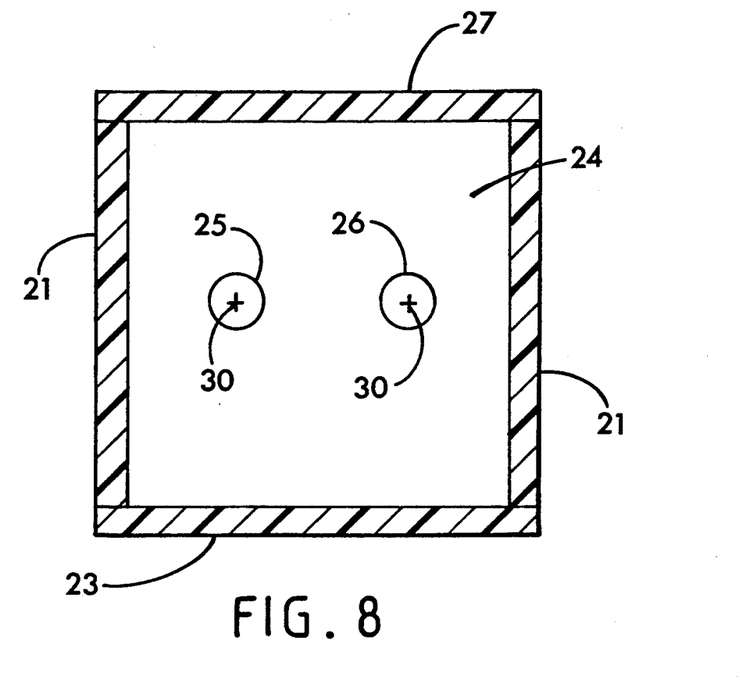
FIG. 8 is a cross-sectional view through the phantom of FIG. 7 taken along the lines 8—8 of FIG. 7, showing the arrangement of inclusions therein.
Figure 9:
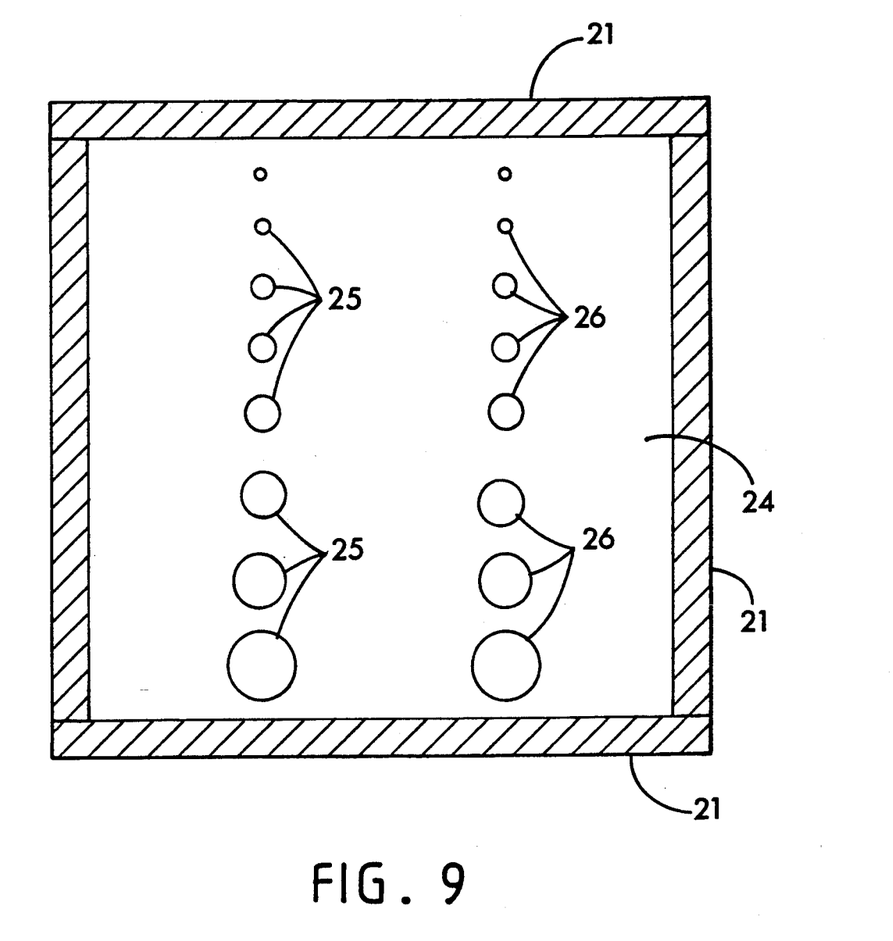
FIG. 9 is a cross-sectional view through the phantom of FIG. 7 taken along the lines 9—9 of FIG. 7.

The exemplary phantom can be formed as the rectangular box 20 shown in FIGS. 7 and 8, preferably having side and bottom walls 21 of a suitable plastic material, such as Lucite (TM), which are commonly used in the construction of phantoms for NMR, ultrasound, and so forth. As illustrated in the cross-sectional views of FIGS. 8 and 9, the phantom container 20 has side walls 21 and a bottom wall 23 glued together to form a container into which the base tissue mimicking material 24 is poured. A syringe may be mounted on the top of the container for the final filling and elimination of air from the phantom. A first set of spherical inclusions 25 and a second set of spherical inclusions 26 are distributed within the base tissue mimicking material at an appropriate height in the container. The top of the container is sealed with a plastic cover 27 affixed to the tops of the sides of the container, with the molten tissue mimicking material being injected into the interior of the container using a syringe (not shown).

The spherical inclusions used in the phantom can be made from molds that consist of opposing pairs of acrylic plastic (e.g., Lucite TM) blocks with hemispherical depressions. Suitable exemplary diameters for these spherical inclusions are 31.8, 12.7, 9.5, 7.5, 6.3, 4.7, 4.0, 3.0 and 2.0 mm. Before introduction of molten gel into the molds, the molds may be coated with a thin layer of petroleum jelly to prevent the congealed spheres from sticking to the molds, and the molds are then heated in a 45° C. oven to warm the blocks to help prevent premature congealing of the molten gel onto a cold mold surface. While the molds are warming, the molten gel material is prepared and poured into a dish deep enough to cover all of the molds. The molds are taken from the oven and slowly immersed in molten gel. Any air bubbles are removed before the two halves are placed together. The gel shrinks slightly as it congeals and to prevent air from moving into the spherical enclosures, the molds are left submerged in the gel until congealing is complete.

Three days after the spherical inclusions have congealed, they are removed from the molds, mounted in the phantom box and surrounded with molten base tissue mimicking material. It requires approximately three days for the formaldehyde in the gel to make the cross links of the long chains in the animal hide gel that raises the melting point. The higher melting point prevents the surrounding molten base tissue mimicking material from melting the spheres. The surrounding gel is usually poured at at temperature of about 34° C.

Those spherical inclusions that are less than 1.5 cm in diameter are initially placed during filling of the phantom using thin (0.3 mm diameter) stainless steel wires that have a coating of petroleum jelly thereon and on which the spherical inclusions are skewered. Two wires are preferably strung from one end to the other of the walls 21 of the container, the positions of which are indicated by the crosses 30 in FIG. 8. After the base tissue mimicking material was hardened, the wires holding the spheres are removed by withdrawing the wires through one side of the box. Plastic caps are then glued over the holes in the box through which the wires were removed. When the large diameter spheres e.g., 31.8 mm diameter spheres, are to be placed in the phantom, suspending wires are not used since the wires tend to cut these spheres because of gravitational forces on the spheres. Instead, these spherical inclusions are placed on a supporting layer of the base material gel that has been poured earlier and allowed to congeal before the surrounding molten gel is introduced. Desiccation of the gels is prevented by placing the phantom container in a pyrex glass dish, surrounding the phantom with another gel layer, and pouring a layer of molten petroleum jelly on top. A layer of foam rubber and another Lucite wall over it can be utilized to provide the phantom the durability needed for routine clinical or research use.

EXAMPLE IV

As an example of tissue mimicking materials that may be utilized in the phantom 20, the background tissue mimicking material was made from a solution having volume percentages of 25% glycerol, 8.3% n-propanol, and 66.7% water. The molten agar portion was made with 4.5 g dry weight agar per 100 ml of solution and the molten animal hide gel portion was made with 23.3 g dry weight gelatin per 100 ml solution. Three parts by volume of molten agar were mixed with two parts molten animal hide gel, corresponding to an "X" value of 40. The spherical inclusions 25 and 26 are made in a similar manner but with a dry weight concentration of agar of 2% for the high contrast spherical inclusions 25 and 3% for the low contrast spherical inclusions 26. The fluid components were identical in composition for the two sets of spheres 25 and 26, as were the animal hide gel concentration and the volume ratio of the two molten gel components. The spherical inclusions have diameters ranging from a larger size of 12.7 mm down to a smaller size of 2 mm.

Figure 10:
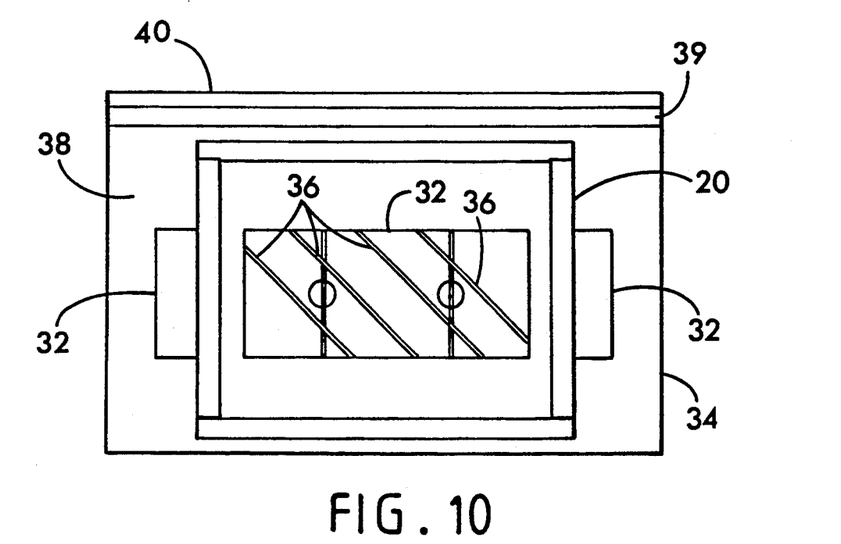
FIG. 10 is a side view of a phantom as in FIG. 7 further incorporating calibration test objects.
Figure 11:
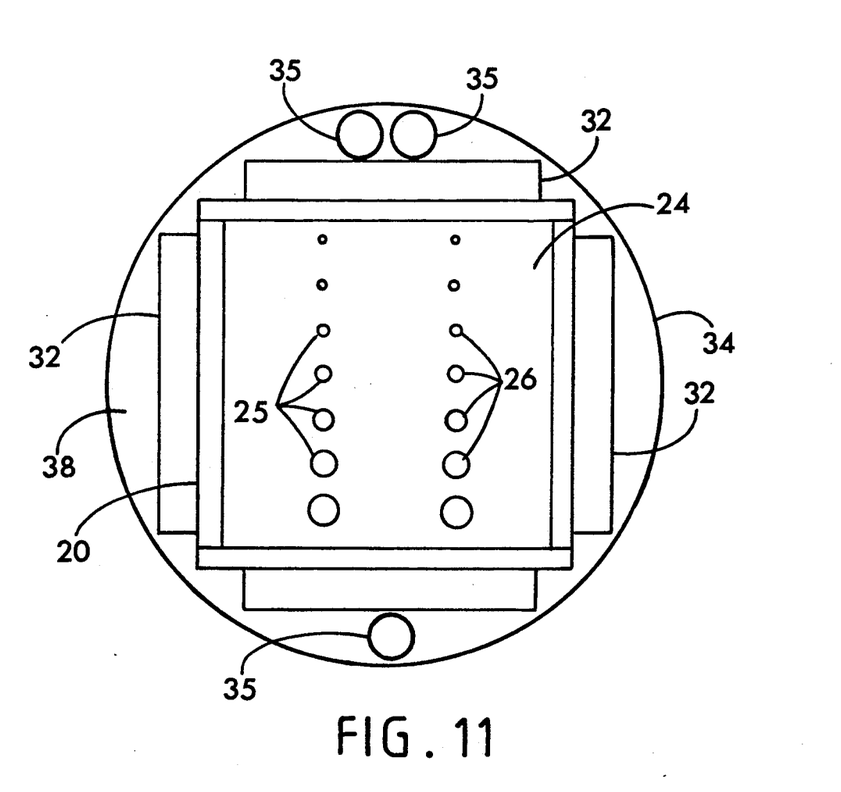
FIG. 11 is a top view of the phantom device of FIG. 10 which the inclusions are illustrated therein for purposes of illustration.
Figure 12:
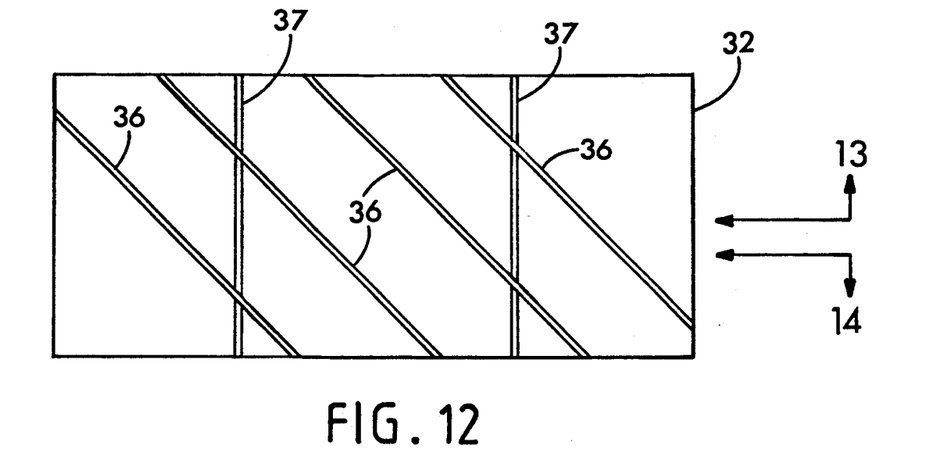
FIG. 12 is a side elevation view of the slice position indicators for the phantom device of FIGS. 10 and 11.
Figure 13:
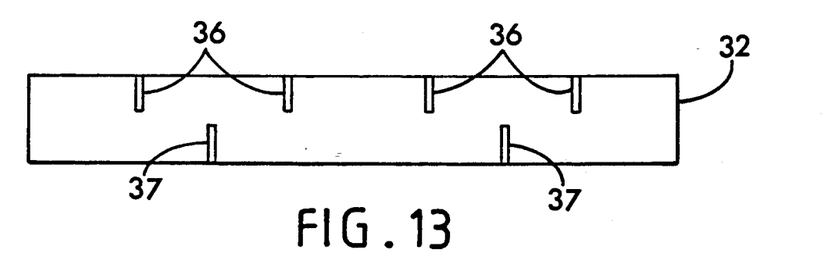
FIGS. 13 and 14 are cross sectional views through the slice position indicator of FIG. 12 at two different heights.
Figure 14:
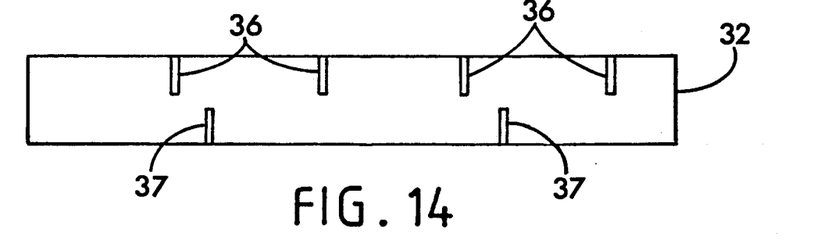

FIGS. 10 and 11 are views of a phantom device in which the phantom 20 is mounted within a Pyrex (TM) dish 34 and has slotted Lucite (TM) blocks 32, one mounted on each of the four sides of the container for the phantom 20, which are used for determining the imaging slice position and profile. The plastic block 32 has four diagonal slots 36 and two vertical slots 37 machined in them, as shown in the side view of FIG. 10. The slots are filled with a gel that produces a signal while the plastic of the block does not. A shift in the slice position is revealed as a translation of the image of the slots 36 relative to the image of the vertical slots 37. Small isolated glass reference vials 35 containing the three types of gel inside the phantom, are sealed in with petroleum jelly, are also placed between the other container 34 Pyrex wall and the inner container 20 of the phantom. Additional base tissue mimicking material 38 surrounds the inner container 20 and filss the outer container 34 to a level near its top. A layer of petroleum jelly 39, deposited in a molten state, covers the tissue mimicking material 38 across the top of the container 34 to seal out oxygen and prevent moisture loss. A plastic or plastic and foam rubber cover 40 may be mounted across the top of the outer container 34 to complete the enclosure.

For this phantom, high contrast spheres 25 have a $T_1$ of 650 ms and a $T_2$ 145 ms at 10 MHz. The low contrast spheres have a $T_1$ of 658 ms and $T_2$ of 117 ms at 10 MHz, and the base tissue mimicking material 24 has a $T_1$ of 645 ms and $T_2$ of 82 ms at 10 MHz. At 40 MHz the high contrast spheres have a $T_1$ of 884 ms and a $T_2$ of 126 ms, the low contrast spheres have $T_1$ of 878 ms and a $T_2$ of 109 ms, and the base material has a $T_1$ of 891 ms and a $T_2$ of 90 ms.

Verification that the values of T, and $T_2$ for the three types of materials do not change was done by periodically imaging the phantom onr a General Electric Signa MR imager and making three observations. First, the signal strengths in the three sealed vials always matched those of the corresponding tissue mimicking materials 24, 25 and 26. Second, measurements of the diameter of the spherical inclusions on the images showed that the diameters did not change from the time of production. Third, computed values of $T_2$'s were done using available software for the GE Signa, and the $T_2$'s in the sealed vials and in the corresponding spheres remained essentially identical.

As another example of tissue mimicking materials that can be utilized to obtain the difference in NMR properties between the base tissue mimicking material and the inclusions, a phantom may be formed as described above with the base tissue material loaded with a finely powdered solid filler material which does not produce an NMR detectable signal because it has relatively little effect on the NMR relaxation times, and $T_1$ and $T_2$. Except for the partial volume occupied by the powdered solid filler material, the gel and solution contents may be the same throughout the phantom, both in the base tissue mimicking material and in the spherical inclusions. Contrasts between the inclusions and the base material is produced by the differing $^1$H pseudo-densities. The density of protons $^1$H is directly proportional to the signal strength, so by adding a solid that has little signal, some of the gelatin solution is displaced, decreasing the apparent $^1$H density to the NMR instrument with little change in the relaxation times. One example of the background that may be used is the uniform suspension of finely powdered nylon. In an exemplary phantom, 2% of the base material 24 consists of finely powdered nylon and in the two sets of spheres 25 and 26, the high contrast set 25 has no nylon and the low contrast set 26 has 1% nylon. For these exemplary materials, at 10 MHz, the high contrast sphere has a $T_1$ of 596 ms and $T_2$ of 88.4 ms, the low contrast spheres had a $T_1$ of 582 ms and a $T_2$ of 86.7 ms, and the base material had a $T_1$ of 614 ms and $T_2$ of 85.9 ms. At 40 MHz, the high contrast spheres had a $T_1$ of 882 ms and a $T_2$ of 105 ms, the low contrast spheres had a $T_1$ of 811 ms and $T_2$ of 104 ms and the base material had a $T_1$ of 810 ms and $T_2$ of 104 ms.

The spherical inclusions formed in the foregoing manner and of the foregoing materials had excellent long term stability, with substantially no variation in either conformation of the inclusions or their NMR properties. Because the inclusions are stable in their dimensions over time, it is also possible to form such inclusions in anthropomorphic shapes, such as major components of the breast, brain or kidney. These may be used for realistic and challenging tests of the NMR imaging systems as well as in training of personal in imaging techniques.

It is understood that the invention is not confined to the particular embodiments herein illustrated and described, but embraces such modified forms thereof as come within the scope of the following claims.

What is claimed is:

1. A tissue mimicking NMR phantom for testing NMR imagers which is stable dimensionally and in NMR properties over time, comprising:
   (a) a container formed of walls enclosing an interior space, the walls formed of material which does not impede NMR imaging;

(b) tissue mimicking material comprising a solidified gel filling the interior of the container, the gel formed from a mixture of agar and animal hide gelatin, water and glycerol, and (c) at least one inclusion of a defined shape suspended within and in contact with the tissue mimicking material, the inclusion formed of a solidified gel identical in composition to that of the solidified gel forming the tissue mimicking material except in the concentration of one component that changes the $T_1$, $T_2$, or both of the inclusion with respect to the surrounding tissue mimicking material wherein the $T_1$, and $T_2$, or both of the inclusion is substantially stable over time.

2. The NMR phantom of claim 1 wherein the solidified gel in the container further includes an agent mixed therein for inhibiting attack by microorganisms.

3. The NMR phantom of claim 2 wherein the agent for inhibiting attack by microorganisms is selected from the group consisting of n-propanol, p-methylbenzoic acid, formaldehyde, and mixtures thereof.

4. The NMR phantom of claim 1 including a cross linking agent mixed with the solidified gel to cross link the animal hide gel component to raise the melting temperature of the solidified gel to a temperature substantially above normal ambient temperatures.

5. The NMR phantom of claim 4 wherein the cross linking agent is formaldehyde.

6. The NMR phantom of claim 1 wherein the dry weight of agar as a percent of the total liquid components of the solidified gel is in the range of approximately 1% to approximately 4.5%.

7. The NMR phantom of claim 1 wherein the dry weight of the animal hide gelatin as a percent of the total weight of the liquid components of the solidified gel is in the range from approximately 4.6% to approximately 24%.

8. The NMR phantom of claim 1 wherein the glycerol comprises in the range from approximately 10% to approximately 50% of the liquid components of the solidified gel.

9. The NMR phantom of claim 1 including a powdered solid filler material uniformly mixed in the solidified gel which occupies volume but does not produce detectable NMR signals.

10. The NMR phantom of claim 1 wherein the component that is changed between the inclusion and the tissue mimicking material is the concentration of agar on a dry weight basis.

11. The NMR phantom of claim 10 wherein there are several inclusions forming at least two sets of inclusions, the dry weight concentration of agar in each set of inclusions being the same within each inclusion in a set of inclusions, and the dry weight concentration of each set of inclusions differing from that of the other set and from the surrounding tissue mimicking material, thereby providing higher and lower contrast inclusions when the phantom is imaged on NMR imaging apparatus.

12. The NMR phantom of claim 1 wherein the inclusion is spherical in shape.

13. The NMR phantom of claim 1 including a powdered solid filler material intermixed in the tissue mimicking material that occupies volume but does not produce an NMR detectable signal, the concentration of the filler material differing between the inclusion and the tissue mimicking material so as to result in an effective difference in hydrogen density between the inclusion and the base tissue mimicking material.

14. The NMR phantom of claim 1 wherein there are several inclusions of differing sizes down to a small size at the limit of the expected resolution capabilities of an NMR imager.

15. The NMR phantom of claim 14 wherein the inclusions are spherical.

16. The NMR phantom of claim 1 wherein the container further includes slice position indicators mounted on the external sides of the walls of the container, the slice position indicators comprising blocks of plastic material which is not responsive to NMR with grooves formed perpendicularly and obliquely in the blocks with respect to the plane along which the phantom will be imaged by an NMR imager, an NMR responsive material filling the grooves such that when the NMR phantom is imaged by an NMR imaging apparatus taking a slice at a particular level through the phantom, the slice will cut through the obliquely angled slots and will show a mark at the position of the material within the slots at which the slice cuts, with the horizontal displacement of the responsive mark indicating the relative depth of the slice.

17. A tissue mimicking NMR phantom for testing NMR imagers which is stable dimensionly and in NMR properties over time, comprising:

(a) a container formed of walls enclosing an interior space, the walls formed of material which does not impede NMR imaging;

(b) tissue mimicking material comprising a solidified gel filling the interior of the container, the gel formed from a mixture of agar and animal hide gelatin, water and glycerol, and including a powdered solid filler material uniformly mixed in the solidified gel which occupies volume but does not produce detectable NMR signals, wherein the filler material is finely powdered nylon.

18. An NMR phantom for testing NMR imaging apparatus, which is stable in dimensions and NMR properties over time, comprising:

(a) a container formed of walls enclosing an interior space, the walls formed of a material which does not impede the NMR imaging;

(b) a base tissue mimicking material within the enclosed volume of the container, the tissue mimicking material comprising a solidified gel, the gel solidified from a mixture of agar, water and at least another gelling agent; and (c) at least one inclusion of selected shape within and in contact with the base tissue mimicking material, the inclusion formed of a solidified gel of the same mixture as that forming the base tissue mimicking material except differing in the dry weight concentration of agar so as to result in a contrast difference between the inclusion and the base tissue mimicking material when the phantom is imaged by NMR imaging apparatus wherein the contrast difference between the inclusion and the base tissue mimicking material is substantially stable over time.

19. The NMR phantom of claim 18 wherein the base tissue mimicking material and the inclusion are formed of a gel solidified from a mixture of agar, water, animal hide gelatin, glycerol, an agent for inhibiting attack on the gel by microorganisms, and a cross-linking agent to cross-link the animal hide gel to raise the melting points substantially above normal ambient temperatures.

20. The NMR phantom of claim 19 wherein the agent for inhibiting attack by microorganisms is selected from the group consisting of n-propanol, p-methylbenzoic acid, formaldehyde, and mixtures thereof.

21. The NMR phantom of claim 19 wherein the cross linking agent is formaldehyde.

22. The NMR phantom of claim 19 wherein the dry weight of the animal hide gelatin as a percent of the total weight of the liquid components of the solidified gel is in the range from approximately 4.6% to approximately 24%.

23. The NMR phantom of claim 19 wherein the glycerol comprises in the range from approximately 10% to approximately 50% of the liquid components of the solidified gel.

24. The NMR phantom of claim 18 wherein the dry weight of agar as a percent of the total liquid components of the solidified gel is in the range of approximately 1% to approximately 4.5%.

25. The NMR phantom of claim 18 including a powdered solid filler material uniformly mixed in the solidified gel forming at least the base tissue mimicking material which occupies volume but does not produce NMR detectable signals.

26. The NMR phantom of claim 25 wherein the filler material is finely powdered nylon.

27. The NMR phantom of claim 25 wherein the relative amount of solid filler material in the gel forming the inclusion is different than the amount in the base tissue mimicking material.

28. The NMR phantom of claim 18 wherein there are several inclusions forming at least two sets of inclusions, the dry weight concentration of agar in each set of inclusions being the same within each inclusion in a set of inclusions, and the dry weight concentration of each set of inclusions differing from that of the other set and from the surrounding tissue mimicking material, thereby providing higher and lower contrast inclusions when the phantom is imaged on NMR imaging apparatus.

29. The NMR phantom of claim 18 wherein the inclusion is spherical in shape.

30. The NMR phantom of claim 18 wherein there are several inclusions of differing sizes down to a small size at the limit of the expected resolution capabilities of an NMR imager.

31. The NMR phantom of claim 30 wherein the inclusions are spherical.

32. The NMR phantom of claim 18 wherein the container further includes slice position indicators mounted on the external sides of the walls of the container, the slice position indicators comprising blocks of plastic material which is not responsive to NMR with grooves formed perpendicularly and obliquely in the blocks with respect to the plane along at which the phantom will be imaged by an NMR imager, an NMR responsive material filling the grooves such that when the NMR phantom is imaged by an NMR imaging apparatus taking a slice at a particular level through the phantom, the slice will cut through the obliquely angled slots and will show a mark at the position of the material within the slots at which the slice cuts, with the horizontal displacement of the responsive mark indicating the relative depth of the slice.

33. A method of producing tissue mimicking material for NMR phantoms comprising the steps of:
    (a) mixing agar, water, and glycerol together and heating to form a molten agar gelling liquid in which the ratio of the quantity of glycerol to water is at a selected value;
    (b) mixing animal hide gelatin, water and glycerol together and heating to form a molten animal hide gelling liquid, the rate of glycerol to water bearing the same value as the ratio of glycerol to water in the agar gelling liquid;
    (c) mixing together selected quantities of the agar gelling liquid and the animal hide gelling liquid while in the molten liquid state to form a uniformly mixed gelling liquid;
    (d) adding a cross-linking agent to the mixture of the agar gelling liquid and the animal hide gelling liquid which will cause the animal hide gel to cross link, and then cooling the mixture to cause gelling and cross linking to thereby form a solidified gel having NMR $T_1$ and $T_2$ properties which are stable over time.

34. The method of claim 33 wherein in step (b), n-propanol and p-methylbenzoic acid are mixed with the water and the glycerol the n-propanol and the p-methylbenzoic acid providing resistance in the final solidified tissue mimicking material to bacterial attack.

35. The method of claim 33 wherein the cross linking agent added in step (c) is formaldehyde.

36. The method of claim 33 wherein in step (a) the dry weight of the agar comprises about 1% to about 4.5% of the weight of the liquid components with which it is mixed.

37. The method of claim 33 wherein in step (b) the dry weight of the animal hide gelatin comprises between about 4.6% and about 24% of the weight of the liquid components with which it is mixed.

* * * * *

UNITED STATES PATENT AND TRADEMARK OFFICE
CERTIFICATE OF CORRECTION

PATENT NO. : 5,312,755
DATED : May 17, 1994
INVENTOR(S) : Ernest L. Madsen, et al.

It is certified that error appears in the above-indentified patent and that said Letters Patent is hereby corrected as shown below:

In Column 3, Line 17 of the Patent, "extend" should be --extent--

In Column 3, Line 54 of the Patent, "raise" should be --raises--

In Column 7, Line 46 of the Patent, "time" should be --times--

In Column 16, Line 22 of the Patent, "rate" should be --ratio--

Signed and Sealed this

Fourth Day of April, 1995

Attest:

BRUCE LEHMAN

*Attesting Officer*   *Commissioner of Patents and Trademarks*